United States Patent [19]

Raghavan et al.

[11] Patent Number: 5,054,420
[45] Date of Patent: Oct. 8, 1991

[54] USE OF A PARTICULATE PACKED BED AT THE INLET OF A VERTICAL TUBE MOCVD REACTOR TO ACHIEVE DESIRED GAS FLOW CHARACTERISTICS

[75] Inventors: Narasimha S. Raghavan; Roland S. Timsit, both of Kingston, Canada

[73] Assignee: Alcan International Limited, Montreal, Canada

[21] Appl. No.: 586,672

[22] Filed: Sep. 24, 1990

[30] Foreign Application Priority Data

Sep. 29, 1989 [CA] Canada .................................. 615293

[51] Int. Cl.⁵ .............................................. C23C 16/00
[52] U.S. Cl. .................................... 118/715; 118/725; 118/730
[58] Field of Search ......................... 118/715, 725, 730

[56] References Cited

U.S. PATENT DOCUMENTS 3,996,025 12/1976 Gulden .............................. 239/553.3

FOREIGN PATENT DOCUMENTS 3635647 5/1987 Fed. Rep. of Germany .
62-81019 4/1987 Japan .................................. 118/715

OTHER PUBLICATIONS

Wang, *Flow Visualization Studies for Optimization of OMVPE Reactor Design,* 3rd International Conf. on Metalorganic Vapor Phase Epitaxy, Universal City, Calif., 1986, sponsored by the American Assoc. for Crystal Growth.

*Primary Examiner*—Richard Bueker
*Attorney, Agent, or Firm*—Cooper & Dunham

[57] ABSTRACT

A gas distributing device is provided for a Metal Organic Chemical Vapor Deposition (MOCVD) reactor. The gas distributing device comprises a packed bed of discrete particles located in the inlet of the reactor to provide a vortex-free flow of reactant gas mixture towards the susceptor within the reactor chamber. The packed bed of discrete particles is of sufficient depth to provide a series of tortuous interconnecting channels around and between the particles and through the bed. A porous support is provided for the packed bed in the inlet of the reactor chamber. The porous support device adjacent the reactor chamber permits a reactant gas mixture after having passed through the packed bed to enter the reactor chamber.

17 Claims, 3 Drawing Sheets

USE OF A PARTICULATE PACKED BED AT THE INLET OF A VERTICAL TUBE MOCVD REACTOR TO ACHIEVE DESIRED GAS FLOW CHARACTERISTICS

FIELD OF THE INVENTION

This invention is related to the use of a reactant gas mixture distributing device in a Metal Organic Chemical Vapor Deposition (MOCVD) reactor. The gas distributing device provides a vortex-free flow of reactant gas mixture towards a susceptor in the MOCVD reactor.

BACKGROUND OF THE INVENTION

MOCVD reactors are commonly used to grow epilayers of various metals with sharp interfaces between the epilayers. Normally, MOCVD reactors are oriented in the vertical direction. The reactor has a reactor chamber with an inductively or radiantly heated susceptor. The susceptor is placed with the deposition surface perpendicular to the flow axis of reactant gases through the reactor. The susceptor is often rotated slowly to minimize non-uniform heating effects. Reactants and carrier gases are typically introduced at the top of the reactor and flow down towards the hot susceptor. Due to the expansion of the gases with increasing temperature in approaching the hot susceptor, the reactor leads to destabilizing gas density gradients in the flow of reactant gases. In principle however, a uniform film thickness is deposited on the substrate of the susceptor. The film is made up of molecules of the desired metal of the reactant gas. It is desirable to provide sharp interfaces between the layers of deposited metal. These very thin even layers on the substrate are then used for various applications in the electronic industry. Normally, the metals and the reactant gases are introduced into the reactor chamber as metal-organic gases. The gases are heated to 700° to 800° C. to burn off the organic components with the result that a pure layer of metal is deposited on the wafer surface. The deposited layers of metal thus form what is called an epitaxial layer, that is the deposited metals have the same chemical lattice structure as the substrate. This imparts a property to the interface that causes electrons to behave in unusual ways and it is this property that is exploited in a variety of electronic devices.

The problem experienced with existing types of MOCVD reactors is the formation of gas vortices near the susceptor that cause uneven distribution of the epitaxial layers. These vortices are a product of the inherent gas velocity and the gas density gradients developed by the high temperatures as the gas approaches the hot susceptor. These difficulties with existing MOCVD reactors are discussed in detail in Fotiadis, D. I. et al, "Complex Flow Phenomena in Vertical MOCVD Reactors: Effects on Deposition Uniformity and Interface Abruptness" *Journal of Crystal Growth* 85:154–164 (1987). A Variety of MOCVD reactor configurations are investigated to determine the effect of the reactor configuration on the flow pattern of the reactant gases at various resident times. It is suggested that the inlet of the reactor may be packed with metal screens to achieve uniform inlet flow for the reactor. However, the sudden expansion of the flow into the enlarged cross-section of the reactor chamber creates large recirculation cells or vortices above the susceptor. Furthermore, the use of screens do not appreciably alter the flow characteristics of the incoming reactant gases.

Consideration has also been given to control of the flow of reactant gases in other types of reactors for coating particles. For example, in Lackey, W. J. et al, "Improved Gas Distributor for Coating High-Temperature Gas-Cooled Reactor Fuel Particles" *Nuclear Technology* Vol 35:227–237 (September, 1977) the investigation of various types of porous carbon plates as particularly mechanically treated to provide multiple blind holes are investigated. The advantage of this type of frit is to even out the flow of gases into the fluidized bed of particles. However, as discussed in this article, one of the disadvantages of this type of frit is its high cost of manufacture as well as the problem of the frit clogging with components of the reactants which are introduced to the fluidized bed reactor. Furthermore, it is not clear as to why a frit made of porous carbon and not any other material (stainless steel or incalloy for example) is preferred for the coating process. A possible reason is that, since the coating material is either carbon or silicon carbide (a small amount of carbon is usually present in most gas phase derived silicon carbide), carryover of carbon particles from the porous frit into the region of coating to a small extent perhaps does not affect the quality of the product. However, in the case of a MOCVD reactor for GaAs epilayer growth, one cannot tolerate the carryover of carbon particles (from the porous carbon frit) into the growth area as even ppm levels of carbon on the epilayer can cause a considerable loss in desired properties.

SUMMARY OF THE INVENTION

According to an aspect of the invention, a Metal Organic Chemical Vapor Deposition (MOCVD) reactor has a reactor chamber in which a susceptor is positioned. Means is provided for heating the susceptor to a desired MOCVD operating temperature. An inlet and an outlet for the reactor chamber is provided. The reactor chamber inlet is characterized by having means for distributing reactant gas mixture at the inlet to provide a vortex-free flow of reactant gas mixture towards the susceptor. The gas distributing means comprises:
 i) a packed bed of discrete particles. The bed has a sufficient depth to provide a series of tortuous interconnecting channels around and between the particles and through the bed, and
 ii) means is provided for supporting the packed bed at the inlet for the reactor chamber. This support means is porous adjacent the reactor chamber to permit a reactant gas mixture after having passed through the packed bed to enter the reactor chamber.

In accordance with another aspect of the invention, there is the use of a packed bed of particles in the inlet of a MOCVD reactor. The reactant gas mixture is passed through the packed bed of particles to provide a vortex-free flow of reactant gas mixture towards the susceptor in the reactor chamber of the MOCVD reactor.

DETAILED DESCRIPTION OF THE PREFERRED EMBODIMENTS

The gas distributor device of this invention is discussed with regard to a particular type of MOCVD reactor, although it is understood that the gas distributor device may be used with other types of MOCVD reactors to achieve the desired flow characteristics of the reactant gases in advance of the susceptor in the reactor. It is also appreciated that a variety of susceptor configurations may be employed as used in various types of MOCVD reactors. Generally, the susceptors are radiant or inductively heated. The susceptors are normally formed of carbon. When inductive heating is used, usually a ten to twenty MHZ magnetic field produced by an external electric coil is sufficient to heat the susceptor to the desired temperature in the range of 700° to 800° C. The purpose of the gas distribution device of this invention then is to provide for uniform vortex-free flow of reactant gases/inert gases in advance of the susceptor. The high temperatures of the susceptor can cause density gradients which in normal jet stream flow causes the development of stable vortices. This is a significant problem with normal types of reactor operation, because in changing compositions to be applied to the susceptor substrate, the vortices retain the prior reactants hence resulting in non-uniform and poor definition at the interfaces of the layers. However, with the use of the gas distribution device of this invention, the reactant gases in advance of the susceptor are vortex free to provide for the growth of uniform metal epilayers with clear definition between the epilayers.

It is appreciated that a variety of gaseous reactants are used in MOCVD reactors. For example, the gases may include $H_2/Ga(CH_3)_3/AsH_3/SiH_4$; $H_2/Ga(CH_3)_3/AsH_3$; $H_2/Ga(CH_3)_3/AsH_3/(CH_3)_2Zn$; $(CH_3)_3Ga$, $AsH_3$ and $(CH_3)_3Al$; $(CH_3)_3Ga$, $AsH_3$ and $SiH_4$; $(CH_3)_3Ga$, $AsH_3$ and $(CH_3)_2Zn$. Depending upon the doped metal to be applied to the substrate, the appropriate reactant gas is selected. For example, in applying a gallium arsenide epilayer, one of the above representative gases may be selected.

Figure 1:
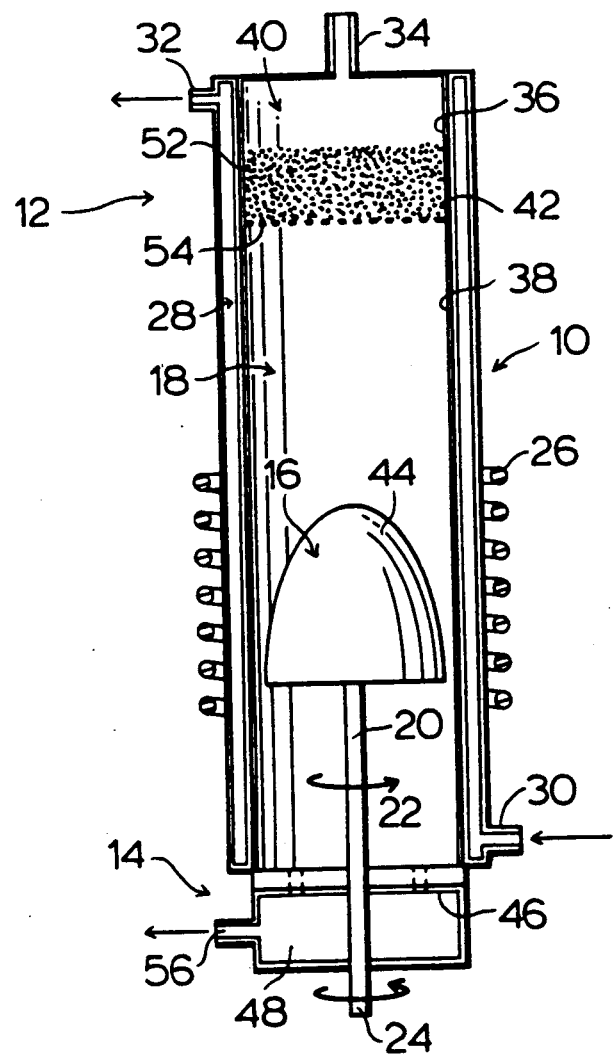
FIG. 1 is a schematic representation of an MOCVD reactor incorporating a gas distributing device of this invention.

With reference to FIG. 1, the preferred type of MOCVD reactor, according to this invention, is shown. The reactor 10 has an inlet portion 12 and an outlet portion 14. A susceptor 16 is provided within reaction chamber generally designated 18. The susceptor is mounted on a shaft 20 which is rotated in the direction of arrow 22 by a suitable drive mechanism (not shown) attached to the base of the shaft 24. This drive mechanism could be of a type which would allow rotation of the shaft in opposing directions. The susceptor 16 is heated, in accordance with this embodiment, by an induction coil 26 in accordance with standard well-known techniques. The susceptor 16 is made of a suitable material to respond to the magnetic field of the inductance coil; for example, carbon is a suitable composition for the susceptor 16. The entire outside of the reactor chamber and inlet is cooled by a suitable coolant jacket 28. The coolant jacket 28 has a coolant inlet 30 through which coolant is, under pressure, forced to flow through the coolant jacket. The coolant is removed from the jacket via the coolant outlet 32. The inlet portion 12 of the reactor 10 has an inlet conduit 34 through which the reactive gases flow. The inlet portion 12 is defined by a cylindrical tubular wall 36 which, in accordance with this embodiment of the invention, is coextensive with the cylindrical, tubular Wall 38 of the reactor chamber 18. The reactive gases enter the inlet region generally designated 40 above the gas distributor device generally designated 42. The reactive gases, after passing through the gas distributor device 42, advance towards the susceptor 16 to deposit the epilayer of metal atoms on the leading portion 44 of the susceptor. After reaction of the gases, the remaining products are exhausted through a plate 46 provided with a circular slit at the base of the reactor and out through the exhaust plenum 48 through the exhaust conduit 50 for disposal.

In accordance with a preferred embodiment of this invention, within the inlet portion of the MOCVD reactor the gas distributor device consists of a packed bed of discrete particles 52. Means within the reactor, which in accordance with this embodiment is a perforated plate 54, is provided on which the packed bed is supported. It is appreciated, however, that depending upon the configuration of the reactor and its orientation various other arrangements may be provided in supporting and containing the packed bed of discrete inert particles for the gas distributing device. The packed bed of discrete particles is of a height or sufficient depth to provide a series of tortuous interconnecting channels around and between the particles and through the bed. Hence the bed of particles provides a large number of effective gas inlets each with a diameter considerably smaller than the true reactor inlet diameter. The packed bed then reduces the cross-sectional area for gas flow at the inlet. For a constant mass flow rate, the flow velocity of the gas entering the reactor is thus greater than in the absence of the packed bed arrangement. The increased entry velocity of the gases reduces the resident time for the gases in the reactor and hence reduces the possibility of vortex formation above the susceptor. In an MOCVD reactor, according to this invention, passage of the reactant gas through the tortuous path within the particle bed leads to thorough mixing of the various reactants in the reactor gas to provide for a more uniform epilayer growth on the susceptor substrate. The elimination of vortices and the thorough gas mixing leads to a uniformity in gas distribution that is highly desirable in an MOCVD reactor and could not be provided with the fire-types of reactor designs.

Preferably the packed bed of the gas distributor device of this invention consists of solid inert particles of a size varying from 4 to 12 mesh. Preferred size ranges are either 4 to 8 mesh or 8 to 12 mesh. The particles, in accordance with a preferred embodiment of this invention, are supported on a porous screen which has pore sizes of 20 mesh. The depth of the packed bed is normally in the range of 1 to 5 cm and preferably in the range of 1.5 cm to 4 cm. In order to prevent or provide for minimal extent of adsorption of reactants on the packed bed, the particulate bed is composed of non-porous, smooth surfaced particles made out of an inert material such as fused silica or sapphire. The size of the particles is dictated by an acceptable pressure drop in the particulate bed. Ideally though, the particles are as already mentioned in the range of 1 mm to 6 mm in diameter of the relative mesh sizes noted. The support for the particulate bed is preferably perforated fused silica plate of sufficient size pores to provide for unconstrained flow, that is, almost zero pressure drop as the reactant gases flow through the supporting plate into the reactor chamber.

Preferably the packed bed in the inlet region of the reactor is removable therefrom. The preferred configuration would provide for the use of a perforated quartz (fused silica) plate. This plate would provide support for the inert particles while constituting an integral part of the MOCVD reactor chamber. Incorporation of such a plate would be achieved by the glass blower in the reactor chamber fabrication process. Such a design allows for simple removal of the particles, which could be withdrawn, after inverting the chamber, through the gas inlet end of the chambers.

Figure 2:
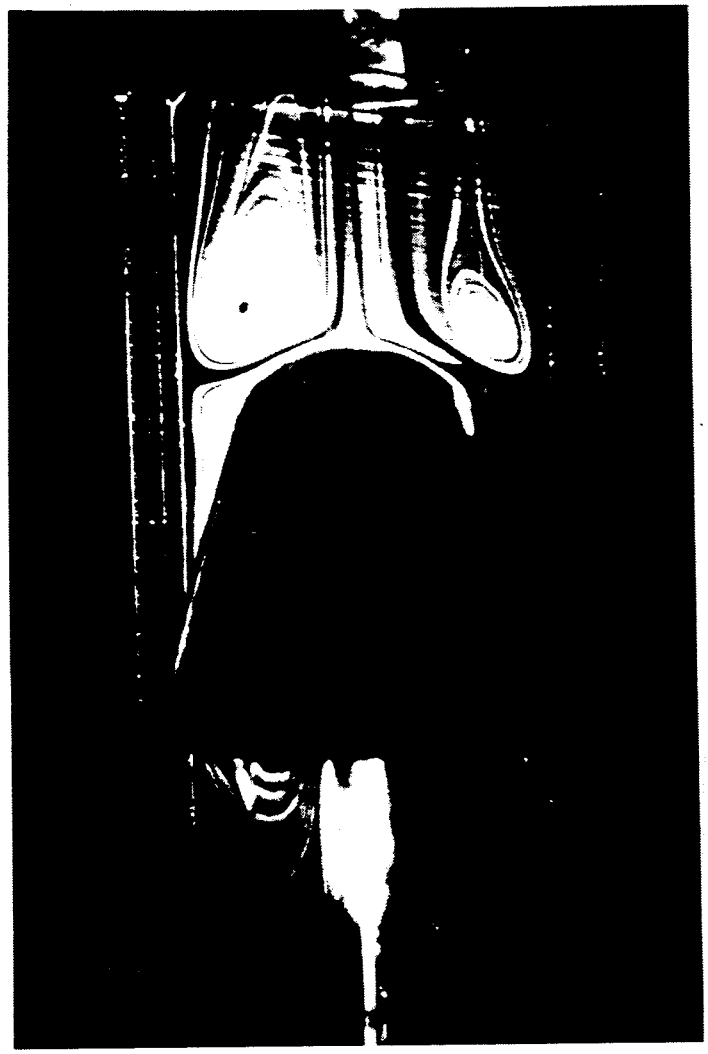
FIG. 2 is a photograph of the flow pattern of a reactor simulation according to the prior art.

With reference to FIG. 2, the normal design for the MOCVD is shown. The reactant gas mixture enters the reactor chamber through an inlet that is less than 2.5 cm in diameter. In view of the gas inlet being situated close to the dome, that is the upper end of the substrate-bearing susceptor, the incoming gas impinges on the dome as a narrow jet rather than as a spread out front. This arrangement for gas introduction leads to a non-uniform reactant gas concentration in the reactor and to the formation of vortices above the susceptor as clearly shown in FIG. 2. These two effects conspire to generate non-uniformities in epilayer thickness, that is thickness of the GAAS layer on the substrate. Non-uniformities in dopant concentration (silicon and zinc due to decomposition of $SiH_4$ and $(CH_3)_2Zn$ respectively, for example) and grated interfaces instead of the desired sharp interfaces between epilayers, such as for example, GaAs-AlGaAS. As already noted, these difficulties with non-homogeneous and non-uniform gas flow can be mitigated by the use of sub-atmospheric reactor pressure. For example, a reduction in the pressure from one atmosphere to 0.1 atmosphere results in a ten-fold increase in gas velocity if the mass flow rate is kept constant. This reduces the resident time of the gas in the reactor and eliminates the formation of vortices. However, although the reduction in resident time increases interface abruptness, it is shown that the uniformity of epilayer and dopant concentration is not necessarily improved by the increased gas velocity.

In accordance with the preferred embodiment of this invention, the use of the particulate bed as the gas distributing device in addition to increasing gas velocity distributes entry of the reactant gas across the entire cross-section of reactor tube and eliminates formation of gas jet. Passage of the reactant gases through the tortuous paths in the particulate bed promotes thorough mixing of the various components of the reactant gases. Such a well-mixed gas distributed uniformly into the reactor at high velocity satisfies all requirements for uniform epilayer growth. With reference to FIG. 1, the additional provision in providing an inlet portion of substantially the same cross-sectional area as the cross-sectional area of the reactor chamber 18 minimizes the development of any types of vortices of the susceptor.

Figure 3:
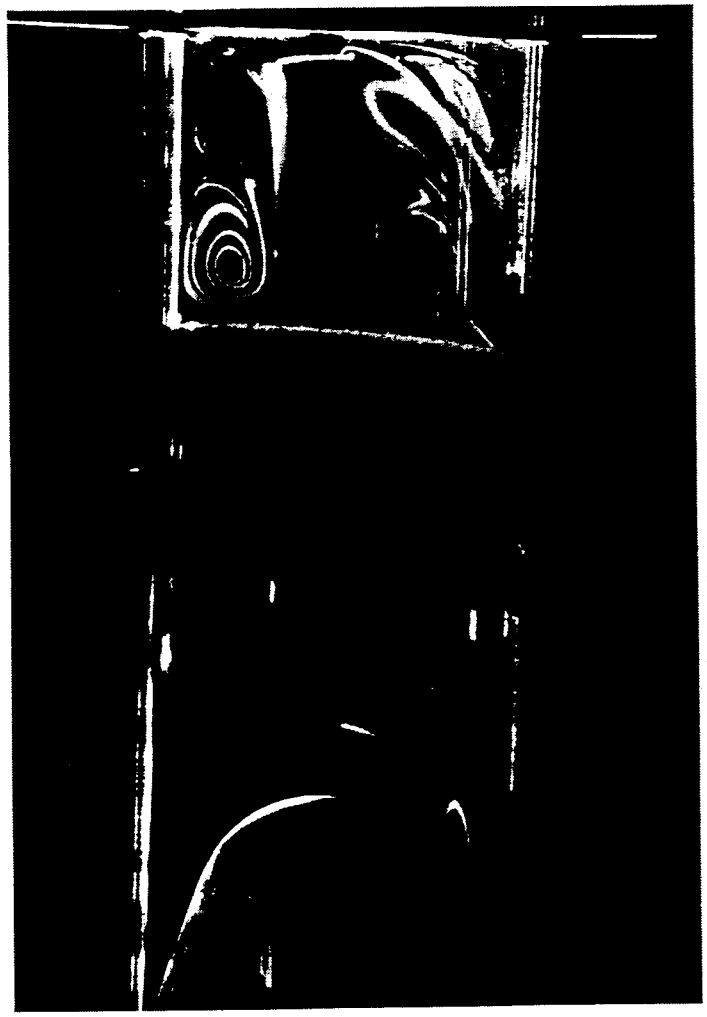
FIG. 3 is a photograph of the flow pattern of a reactor simulation incorporating a gas distributing device of this invention.

The effect of the gas distributing device, according to this invention, is shown in FIG. 3. Above the packed bed vortices in the reactant gases appear. However, the reactant gases, as they emerge from the packed bed and flow towards the susceptor, do not develop any vortices; hence demonstrating the significant improvement in gas flow characteristics achieved by the gas distributing device of this invention, the advantages of which have been explained already.

EXAMPLE 1

In order to test the effectiveness of the gas distributing device of this invention, a "mock" vertical MOCVD reactor under non-reacting conditions was developed. Inert gases such as helium and nitrogen were used instead of the highly toxic reactive vapors $Ash_3$ and $(CH_3))_3Ga$ respectively.

Flow visualization studies were carried out in a cylindrical quartz glass tube of the same size as the commercial MOCVD reactor, but provided with a section in the gas inlet end that contained a particulate bed supported on a wire mesh. This arrangement is shown more clearly in FIG. 3.

Experiments were carried out to verify the presence of a particulate bed at the inlet of the MOCVD reactor resulted in vortex-free flow in the region of interest in advance of the susceptor. That is, the region where the epilayer growth is carried out. Furthermore, the experiments confirmed the reduction in residence time for the gases.

Visualization of the flow pattern was achieved by means of laser illumination of fine particles carried into the reactor by a stream of nitrogen gas of approximately 4 v% of the total flow of helium and nitrogen. The helium gas emulated the role of hydrogen gas, which is the predominant carrier gas in normal operation of an MOCVD reactor. The small rate of nitrogen gas flow served to generate density gradients that occur in practical MOCVD reactors when additional reactants such as $(CH_3)_3Al$ are introduced.

The fine particles, which were submicron in size, were generated by saturating the nitrogen gas with aluminum isopropoxide (approximately 30 w% aluminum isopropoxide and 70 w% toluene). The saturated mixture was heated to a temperature of approximately 950° C. The nitrogen gas containing the submicron size particles was then mixed with the mainstream of helium gas just before the reactor inlet by means of a T-connection. Since the intensity of the scattered light was proportional to the concentration of the particles, it was possible to observe their presence in the reactor and hence expose any vortices which could be developed after emersion of the reactants gases from the gas distributing device. As demonstrated in FIG. 3, none were realized.

Although preferred embodiments of the invention have been described herein in detail, it will be understood by those skilled in the art that variations may be made thereto without departing from the spirit of the invention or the scope of the appended claims.

We claim:

1. In a Metal Organic Chemical Vapor Deposition (MOCVD) reactor having a reactor chamber in which a susceptor is position, means for heating said susceptor to a desired MOCVD operating temperature, an inlet for and an outlet for said reactor chamber, said reactor chamber characterized by having means for distributing reactant gas mixture at said inlet to provide a vortex-free flow of a reactant gas mixture towards said susceptor, said gas distributing means comprising:

i) a packed bed of discrete particles, said bed having a sufficient depth to provide a series of tortuous interconnecting channels around and between said particles and through said bed, and ii) means for supporting said packed bed at said inlet for said reactor chamber, said support means being porous adjacent said reactor chamber to permit a reactant gas mixture after having passed through said packed bed to enter said reactor chamber.

2. In a MOCVD reactor of claim 1, said reactor chamber being elongate, said packed bed as defined by said support means having a cross-sectional area approximately the same as the cross-sectional area of said reactor chamber.

3. In a MOCVD reactor of claim 1, means for cooling said packed bed.

4. In a MOCVD reactor of claim 2, said inlet and said reactor chamber are tubular, said tubular inlet having approximately the same cross-sectional area as said tubular reactor, said packed bed being housed in said tubular inlet to space said porous support means from said susceptor.

5. In a MOCVD reactor of claim 4, said porous support means comprising a porous disc fixed in said tubular inlet to support said packed bed when said reactor chamber is oriented vertically.

6. In a MOCVD reactor of claim 1, said discrete particles having a mesh size range from 4 to 12 mesh.

7. In a MOCVD reactor of claim 6, said discrete particles having a mesh size ranging from 4 to 8 mesh.

8. In a MOCVD reactor of claim 6, said discrete particles having a mesh size ranging from 8 to 12 mesh.

9. In a MOCVD reactor of claim 7 or 8, said packed bed having a depth in the range of 1 cm to 4 cm.

10. In a MOCVD reactor of claim 6, said elongate reactor chamber being oriented vertically, said packed bed extending vertically and said support means comprising a screen of a mesh size which supports particles as small as 12 mesh.

11. In a MOCVD reactor of claim 10, said screen of said support has a 20 mesh.

12. In a MOCVD reactor of claim 1, said discrete particles are smooth surfaced.

13. In a MOCVD reactor of claim 12, said discrete particles being of fused silica or sapphire.

14. In a MOCVD reactor of claim 13, said porous support means is a perforated fused silica plate in said inlet that provides for unconstrained flow of reactant gas mixture into said reactor chamber.

15. In a MOCVD reactor of claim 1, said support means includes means which permits removal of said packed bed from said inlet of said reactor.

16. In a MOCVD reactor of claim 15, said enclosure having means for opening said enclosure to permit removal of said particles.

17. In a method of operating a MOCVD reactor, passing a reactant gas mixture through a packed bed of particles as defined in claim 1.

* * * * *